(12) United States Patent
Kurokawa

(10) Patent No.: US 6,649,017 B1
(45) Date of Patent: Nov. 18, 2003

(54) METHOD OF DETACHING ARTICLE FIXED THROUGH PRESSURE SENSITIVE ADHESIVE DOUBLE COATED SHEET

(75) Inventor: Shuji Kurokawa, Ageo (JP)

(73) Assignee: Lintec Corporation, Tokyo (JP)

( * ) Notice: Subject to any disclaimer, the term of this patent is extended or adjusted under 35 U.S.C. 154(b) by 99 days.

(21) Appl. No.: 09/654,819

(22) Filed: Sep. 5, 2000

(30) Foreign Application Priority Data

Sep. 6, 1999 (JP) .......................................... 11/252274

(51) Int. Cl.[7] .............................................. B32B 35/00
(52) U.S. Cl. ..................... 156/344; 156/584; 29/426.3; 29/426.5; 438/976
(58) Field of Search ............................... 156/344, 584, 156/247; 29/426.1, 426.3, 426.5, 426.6, 426.4; 438/976

(56) References Cited

U.S. PATENT DOCUMENTS

| | | | |
|---|---|---|---|
| 5,534,102 A | * | 7/1996 | Kadono et al. ............. 156/250 |
| 6,176,966 B1 | * | 1/2001 | Tsujimoto et al. ........... 156/344 |
| 6,398,892 B1 | * | 6/2002 | Noguchi et al. ............. 156/85 |

FOREIGN PATENT DOCUMENTS

| | | |
|---|---|---|
| EP | 0 884 766 A | 6/1998 |
| EP | 0 884 766 A2 | 12/1998 |
| EP | 1 061 559 A2 | 12/2000 |
| GB | 2340772 | 3/2000 |
| JP | (1984) 59-171137 A | 9/1984 |
| JP | (1988) 63-21846 A | 1/1988 |
| JP | 11109806 | 4/1999 |

OTHER PUBLICATIONS

Derwent Abstract Accession No. 96–035757/04, JP 07304560–A, Applicant Murata Mfg. Co., Ltd. (1 p.).
Patent Abstracts of Japan, Publication No. 10–060391, publication date of application Mar. 3, 1998; Applicant Hitachi Chem. Co., Ltd. (1 p.).

* cited by examiner

*Primary Examiner*—Richard Crispino
*Assistant Examiner*—Cheryl N. Hawkins
(74) *Attorney, Agent, or Firm*—Webb Ziesenheim Logsdon Orkin & Hanson, P.C.

(57) ABSTRACT

A method of detaching an article (B) from a laminate unit (C), the laminate unit (C) comprising a support plate (A) and, fixed thereto, the article (B), the fixing effected through a pressure sensitive adhesive double coated sheet (1) deformable by heating to thereby exert a peeling effect, which method comprises heating at least one outer part of the laminate unit so that at least part of an outer region of the laminate unit is initially heated up, with other regions heated up later, and detaching the article (B) from the pressure sensitive adhesive double coated sheet (1) in a direction from the outer region toward the other regions. Thus, there are provided a detaching method and a detacher apparatus which enable efficiently detaching an article, such as an extremely thin wafer, having been fixed through a heat shrinkable pressure sensitive adhesive double coated sheet without cracking of the article.

2 Claims, 8 Drawing Sheets

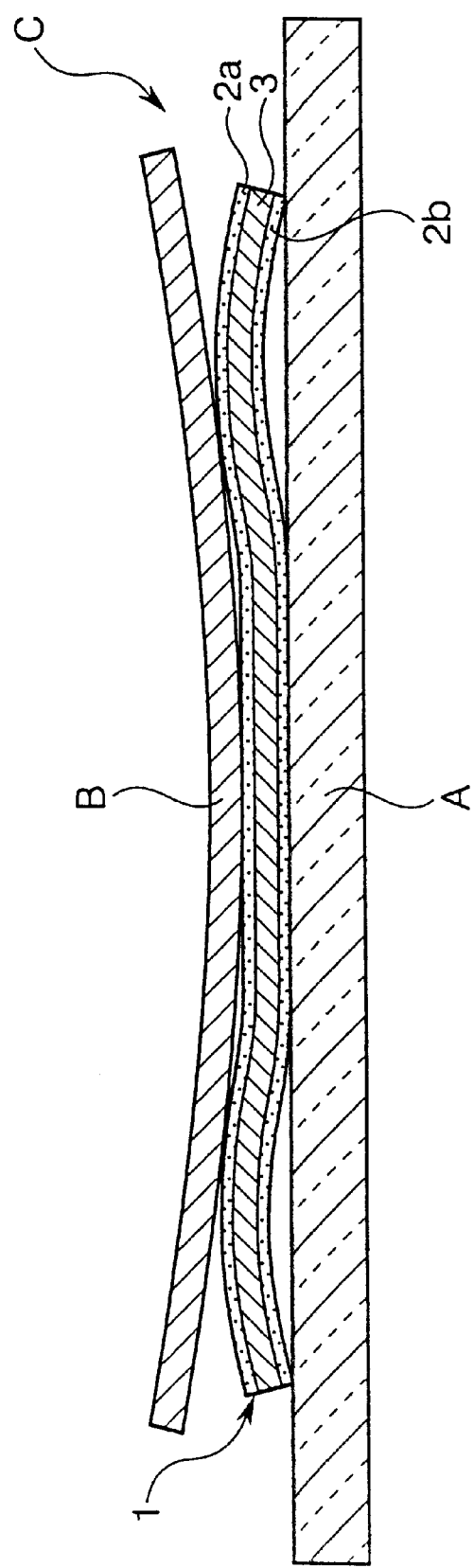

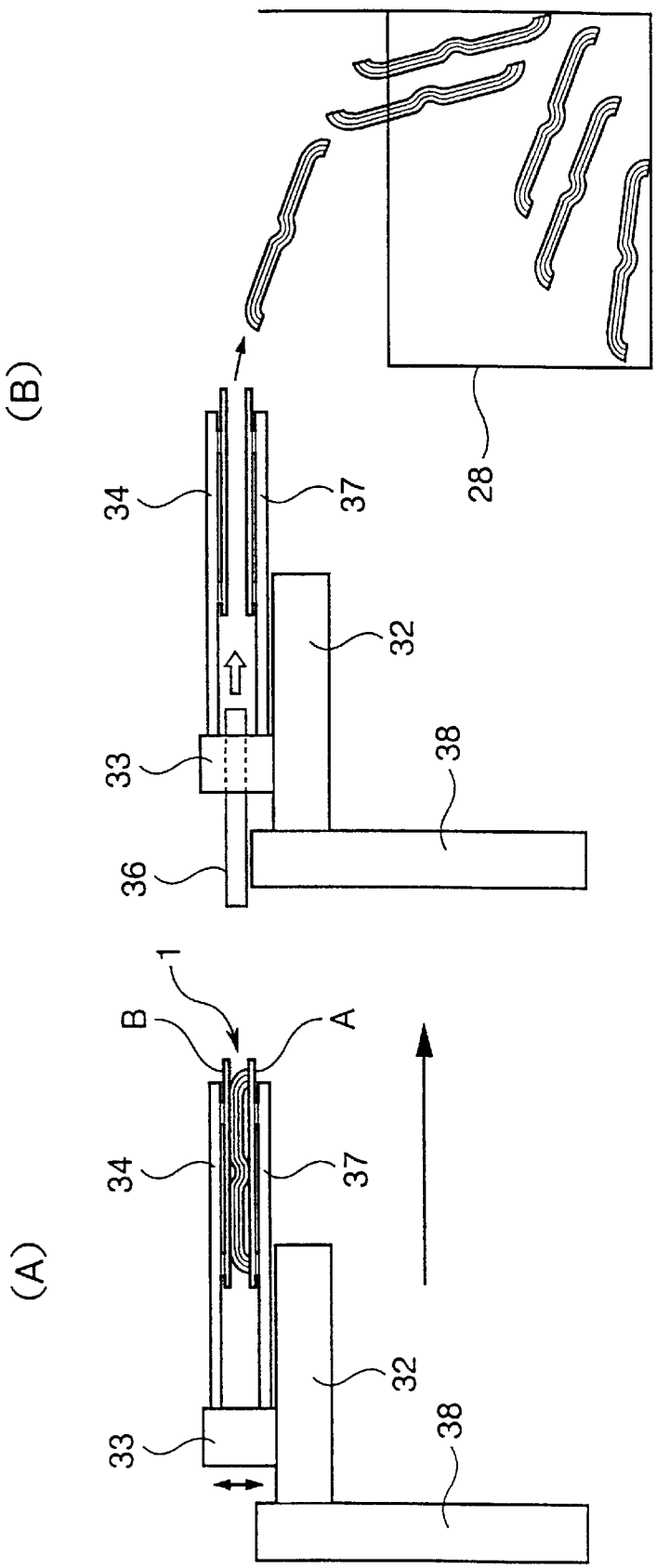

METHOD OF DETACHING ARTICLE FIXED THROUGH PRESSURE SENSITIVE ADHESIVE DOUBLE COATED SHEET

FIELD OF THE INVENTION

The present invention relates to a method of detaching an article fixed through a pressure sensitive adhesive double coated sheet and a detacher apparatus therefor.

BACKGROUND OF THE INVENTION

For example, the wafer of a semiconductor such as silicon is produced in the form of a disc of large diameter. A circuit pattern is formed on a surface of the semiconductor wafer, and the back thereof is ground.

In recent years, there is a demand for the reduction of the thickness of semiconductor chips for IC cards and the like. It is now demanded to reduce the thickness of semiconductor chips produced from the semiconductor wafer, which has been 300–400 μm, to about 100–50 μm. Generally, a pressure sensitive adhesive sheet, which is produced by coating a soft base with a pressure sensitive adhesive, is used for fixing the semiconductor wafer to, for example, a table while protecting the surface of the semiconductor wafer provided with a circuit pattern.

In the detaching of an extremely thin semiconductor wafer from the soft pressure sensitive adhesive sheet, the semiconductor wafer may be cracked during the detaching operation by residual stress resulting from accumulation of the tension applied at the time of sticking. For coping with this problem, the inventors proposed a new pressure sensitive adhesive double coated sheet having pressure sensitive adhesive layers superimposed on a heat shrinkable base, which enabled easily detaching articles by first exposing it to ultraviolet light and thereafter heating the same. In the use of this pressure sensitive adhesive double coated sheet, the first exposure to ultraviolet light lowered the adhesive strength of the pressure sensitive adhesive layers, and the subsequent heating induced shrinking and deformation of the heat shrinkable base to thereby enable easily detaching the articles from the pressure sensitive adhesive sheet.

However, the use of this heat shrink pressure sensitive adhesive sheet has caused the following problem. That is, in the use of the heat shrink pressure sensitive adhesive sheet, shrinking begins at part heated so as to have its temperature raised. When the article is one of small area, the whole is heated and detached within a short period of time, irrespective of the location of heating. Thus, with respect to articles of small area, cracking has been rare. However, when an article of large area is heated at its center, detaching begins at a part near a heating source, with the result that a substantial tensile force is exerted between there and an outer part not yet satisfactorily heated. The tensile force is likely to cause cracking of articles.

In these circumstances, it is the object of an present invention to provide a method of detaching an article fixed through a pressure sensitive adhesive double coated sheet and a detacher apparatus therefor, which enables efficiently detaching articles, such as extremely thin wafers, without cracking thereof by the use of a heat shrink pressure sensitive adhesive double coated sheet.

SUMMARY OF THE INVENTION

For attaining the above object, according to the present invention, there is provided a method of detaching an article from a laminate unit, the laminate unit comprising a support plate and, fixed thereto, the article, the fixing effected through a pressure sensitive adhesive double coated sheet deformable by heating to thereby exert a peeling effect, which method comprises:
heating at least one outer part of the laminate unit so that at least part of an outer region of the laminate unit is initially heated up, with other regions heated up later, and
detaching the article from the pressure sensitive adhesive double coated sheet in a direction from the outer region toward the other regions.

In this constitution, at least one outer part of the laminate unit is initially heated up and thereafter the heated up part can be slowly extended to other regions. Thus, the article can be easily detached from the initially heated up part of the pressure sensitive adhesive double coated sheet.

In the present invention, preferably, the initially heated up outer region of the laminate unit is a peripheral region extending in approximately a doughnut shape from a center of the laminate unit.

In this constitution, the peripheral region is detached initially and the inner region can be detached later. Thus, the article, even if extremely thin, can be easily detached, without cracking thereof, from the pressure sensitive adhesive double coated sheet.

Further, according to the present invention, there is provided a detacher apparatus for detaching an article from a laminate unit, the laminate unit comprising a support plate and, fixed thereto, the article, the fixing effected through a pressure sensitive adhesive double coated sheet deformable by heating to thereby exert a peeling effect, which apparatus comprises heat-up means, the heat-up means including a first heat-up member capable of heating up at least one outer part of the laminate unit and a second heat-up member capable of heating up other parts of the laminate unit later than the first heat-up member.

This apparatus enables easily detaching the article, even if extremely thin, from the pressure sensitive adhesive double coated sheet without cracking of the article.

BRIEF DESCRIPTION OF THE DRAWINGS

FIG. 8 is a sectional view showing the process of detaching of a laminate unit in the detaching method according to one embodiment of the present invention; and FIG. 9 is a side view showing how to remove the pressure sensitive adhesive double coated sheet from the laminate unit after the detaching by means of detacher apparatus according to one embodiment of the present invention.

DETAILED DESCRIPTION OF THE INVENTION

The method of detaching an article fixed through a pressure sensitive adhesive double coated sheet and the detacher apparatus according to the present invention will be described below with reference to the drawings.

Figure 1:
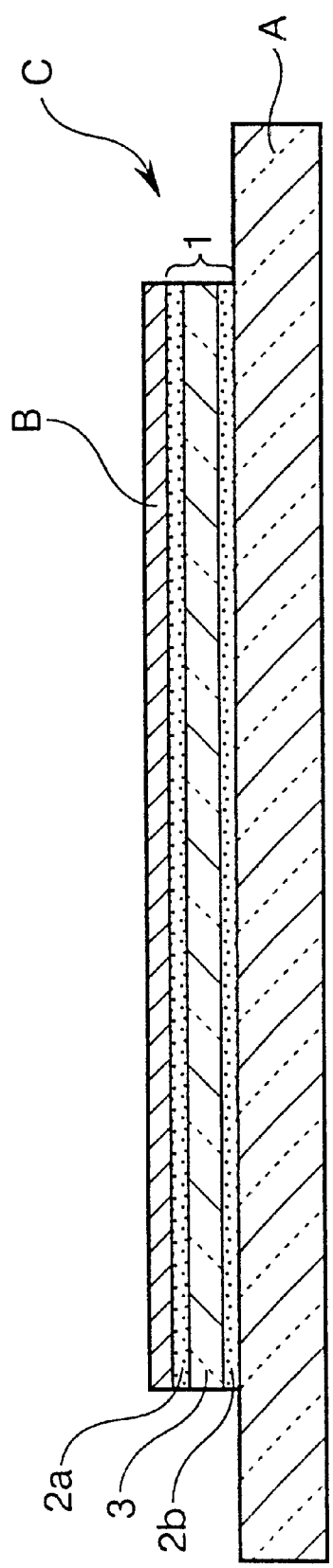
FIG. 1 is a sectional view of a laminate unit in one embodiment of the present invention.
Figure 2:
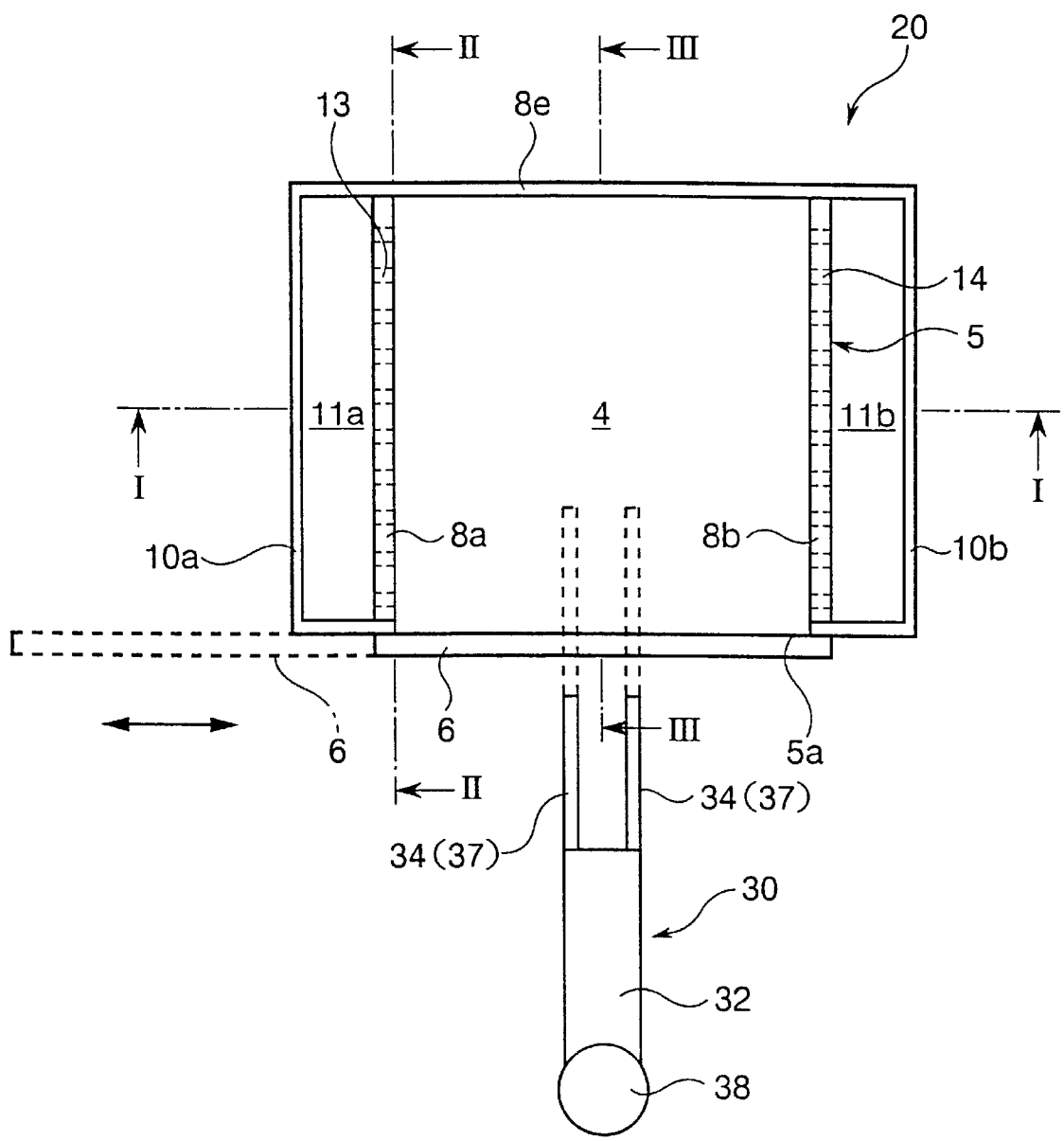
FIG. 2 is a schematic plan view of detacher apparatus according to one embodiment of the present invention.
Figure 3:
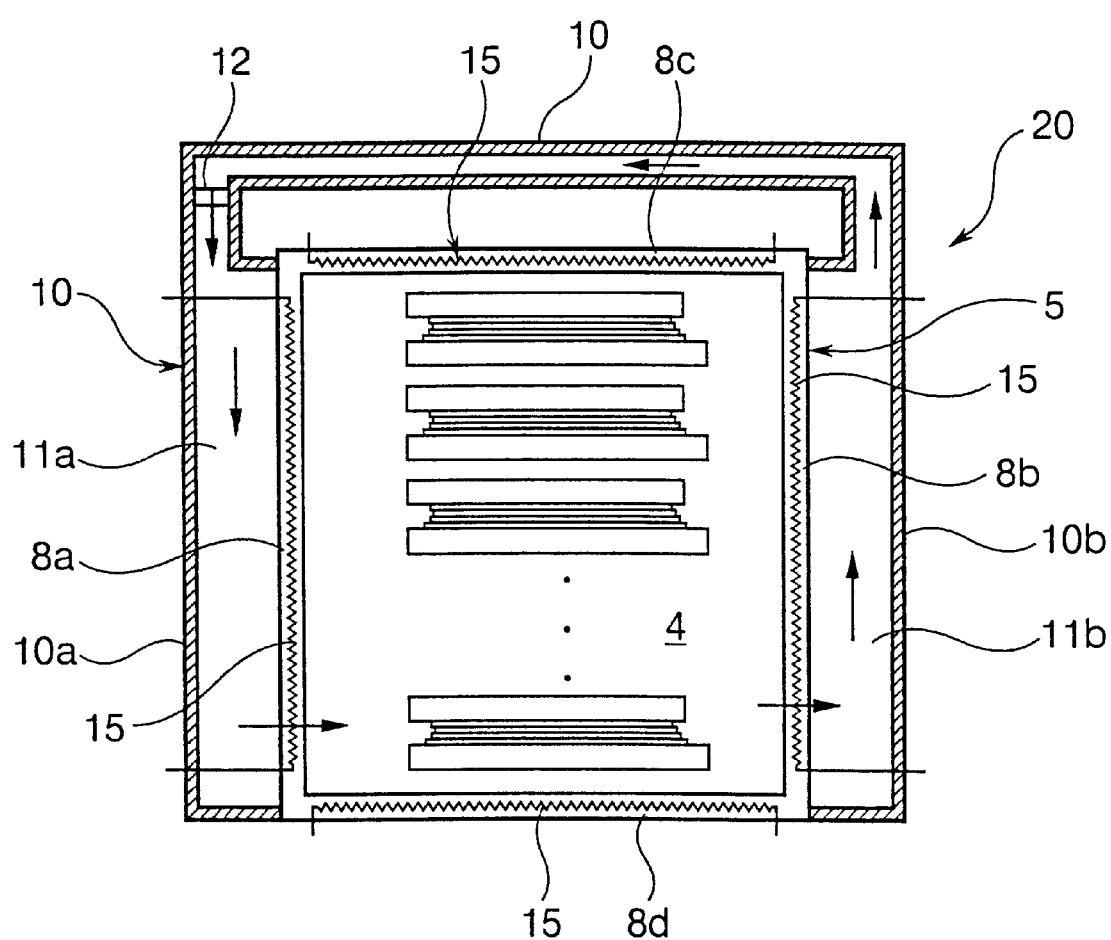
FIG. 3 is a section on the line I—I of FIG. 2.
Figure 4:
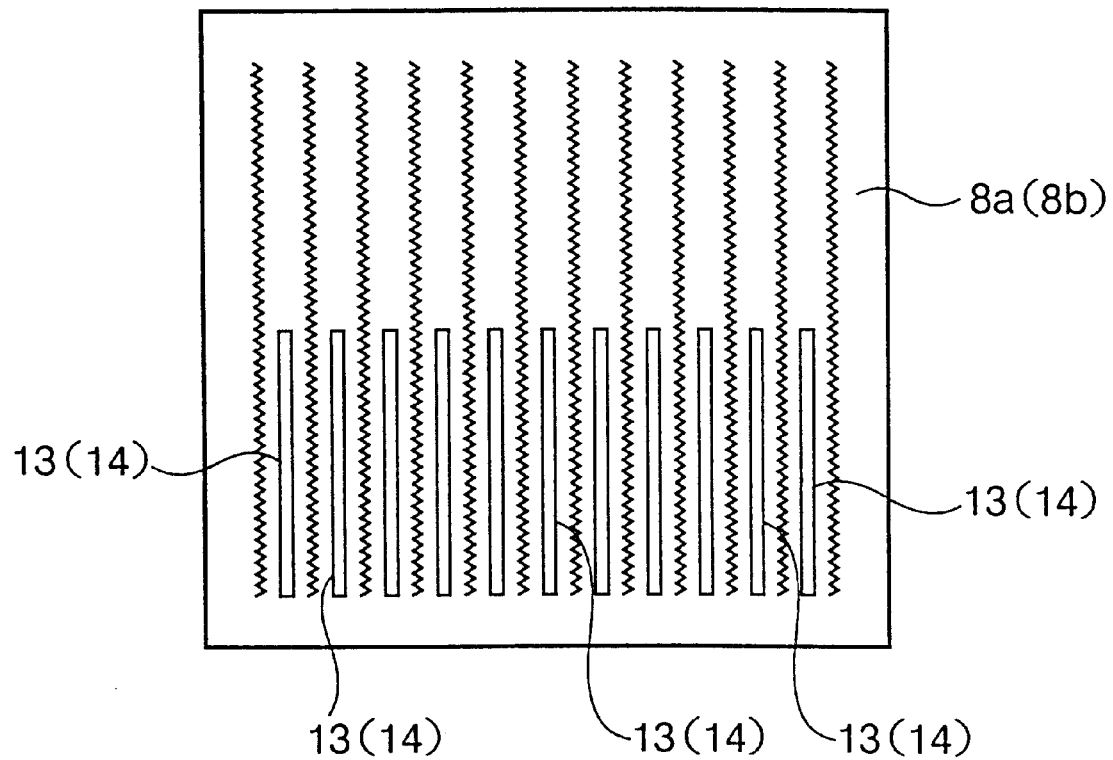
FIG. 4 is an end view along the line II—II of FIG. 2.

FIG. 1 shows laminate unit C for use in this embodiment. FIG. 2 is a schematic plan view of a detacher apparatus capable of heating the laminate unit C and effecting detaching. FIG. 3 is a section on the line I—I of FIG. 2.

As shown in FIG. 1, the laminate unit C comprises pressure sensitive adhesive double coated sheet 1, support plate A stuck to one side of the pressure sensitive adhesive double coated sheet 1 and article B stuck to the opposite side of the pressure sensitive adhesive double coated sheet 1.

In this embodiment, the article B is an unchipped semiconductor wafer. However, the article B is not limited thereto and may be any of insulating bases made of a ceramic or resin, various electronic elements, optical elements such as glass or quartz plates and composites thereof as long as these are planar and have relatively large areas. The shape thereof is not limited to the disc form and can be, for example, a rectangular form.

The pressure sensitive adhesive double coated sheet 1 for use in this embodiment comprises heat shrinkable base 3 and, superimposed on both sides thereof, pressure sensitive adhesive layers 2a, 2b. Although any of the known pressure sensitive adhesives can be used for forming the pressure sensitive adhesive layers 2a, 2b, it is preferred that at least one of the pressure sensitive adhesive layers 2a, 2b be composed of an ultraviolet curable pressure sensitive adhesive. In this embodiment, both of the pressure sensitive adhesive layers 2a, 2b are composed of an ultraviolet curable pressure sensitive adhesive. For details of the pressure sensitive adhesive double coated sheet, reference is made to Japanese Patent Application No. 11(1999)-109806. The pressure sensitive adhesive double coated sheet 1 is not limited to that of this embodiment, and may be, for example, a pressure sensitive adhesive double coated sheet in which a heat foaming agent is mixed in the pressure sensitive adhesive and causes foaming upon being heated to thereby deform the pressure sensitive adhesive layers.

The support plate A is generally a rigid flat plate. When the pressure sensitive adhesive layer 2a, or 2b is composed of an ultraviolet curable pressure sensitive adhesive, it is preferred that the support plate A be, for example, a rigid glass plate or plastic plate composed of an ultraviolet permeable material. It is preferred that the pressure sensitive adhesive double coated sheet 1, support plate A and article B all have approximately the same configuration.

The detacher apparatus of this embodiment will now be described.

The detacher apparatus of this embodiment is one capable of heating the above laminate unit C so that the pressure sensitive adhesive double coated sheet 1 interposed between the support plate A and the article B can naturally be detached. As shown in FIGS. 2 and 3, the detacher apparatus 20, at its inside, has high-temperature chamber 4 enclosed by a double wall.

Specifically, in this detacher apparatus 20, air channels 11a, 11b are provided between a pair of inner side walls 8a, 8b opposite to each other and a pair of outer side walls 10a, 10b opposite to the inner side walls 8a, 8b. These inner side walls 8a, 8b, as shown in FIGS. 2 and 3, are provided with slits 13, 14 arranged at given intervals in the vertical direction.

By virtue of the providing of the inner side walls 8a, 8b with the slits 13, 14, the air inside the high-temperature chamber 4 can flow from one inner side wall to the other inner side wall. Specifically, when fan 12 provided at a ceiling portion is driven, as shown in FIG. 3, air is led so as to flow from the left air channel 11a through the slits 13 into the high-temperature chamber 4. The air having flowed into the high-temperature chamber 4 is led through the slits 14 into the right air channel 11b, and further led upwards. Thus, air circulation as shown by arrows in FIG. 3 is effected.

Figure 5:
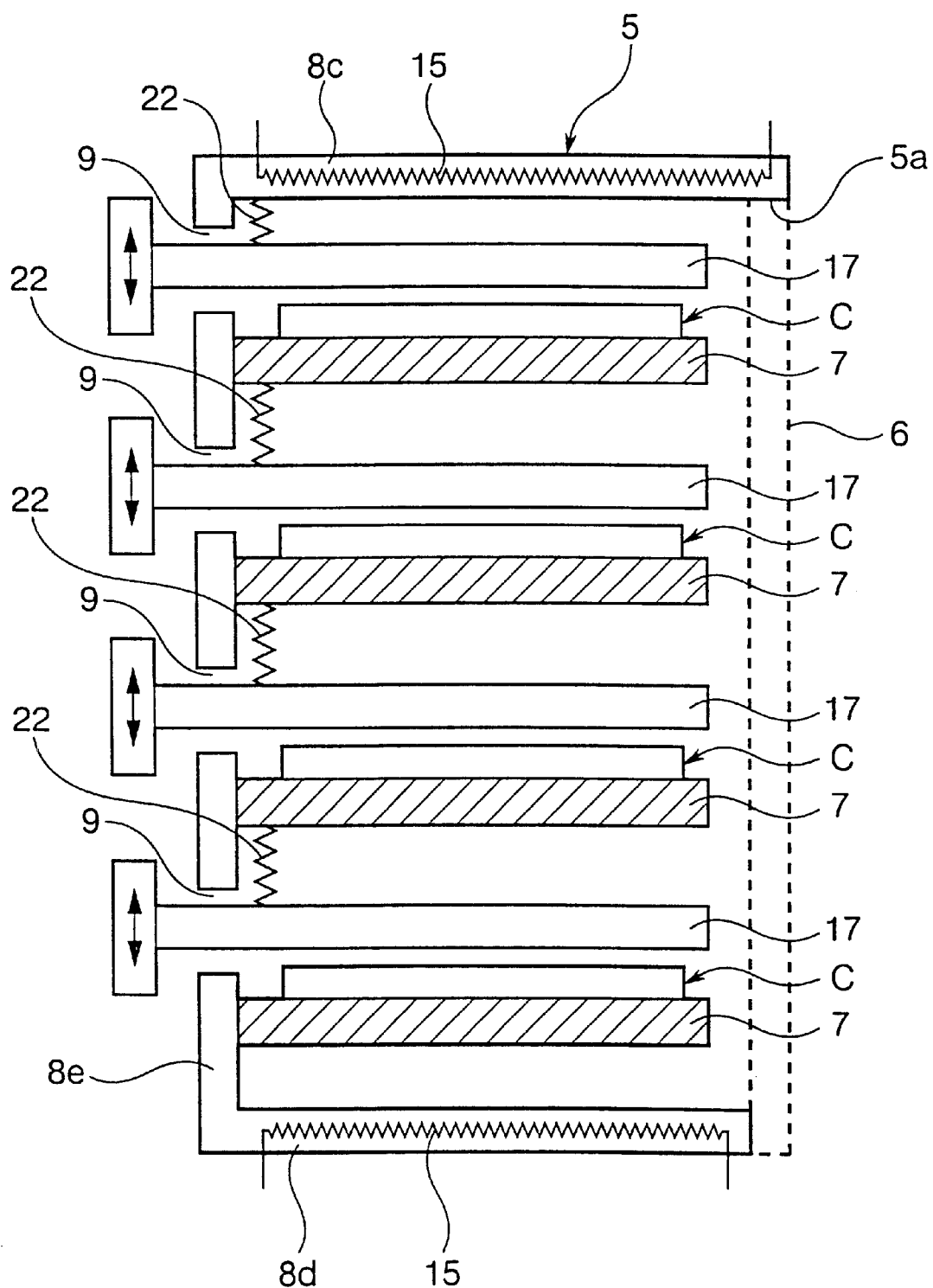
FIG. 5 is a section on the line III—III of FIG. 2.

On the other hand, as shown in FIGS. 2 and 5, the high-temperature chamber 4 includes box-shaped chamber frame 5 with its one side open. This chamber frame 5 is partitioned by the left and right side walls 8a, 8b and the upper and lower side walls 8c, 8d and includes lid 6 that covers opening 5a of the chamber frame 5. This lid 6 is slidable as shown in FIG. 2. This lid 6 is not limited to opening movement in the horizontal direction as shown in FIG. 2, and, for example, may undergo opening movement in the vertical direction.

As shown in FIG. 5, the box-shaped chamber frame 5 is provided with shelf plates 7 protruding from rear side wall 8e, arranged at given intervals in the vertical direction. Each of these shelf plates 7 at an upper surface thereof is provided with minute through holes connected to a vacuum pump and a valve, both not shown, and so constructed that a planar article of, for example, disc or rectangular form can be attracted and fixed thereto by a negative pressure. Further, as shown in FIGS. 3 and 5, the left and right side walls 8a, 8b and the upper and lower side walls 8c, 8d of the chamber frame 5 are provided with heat-up means 15. These heat-up means 15 are for the purpose of heating the inside of the high-temperature chamber 4. As for the heat-up means, known heat-up means, such as a sheathed wire heater, a rubber heater and a far infrared heater can be used. The heat-up means is not particularly limited.

On the other hand, the rear side wall 8e as a constituent of the high-temperature chamber 4 is provided with apertures 9 arranged at given intervals in the vertical direction. Through these apertures 9, vertically movable presser plates 17 are housed in the high-temperature chamber 4, namely the chamber frame 5. The vertical movements of these presser plates 17 may be either separately controlled or simultaneously controlled. Spring 22 is provided between each of the presser plates 17 and the shelf plate 7 positioned above the presser plate 17. With respect to the uppermost presser plate 17, the spring 22 is provided between the presser plate 17 and the upper side wall 8c. The apparatus is so constructed that, when these presser plates 17 are positioned downwards, the springs 22 are elongated to thereby exert an upward tensile force. Each of the springs 22 is adjusted so that, in the elongated state, the upward tensile force substantially balances with the gravity of the presser plate 17. Thus, the apparatus is so constructed that, when the pressure sensitive adhesive double coated sheet 1 is deformed, there is no downward exertion of the gravity of the presser plate 17 to thereby be free from hindering the deformation of the pressure sensitive adhesive double coated sheet 1.

Each of the presser plates 17 at a lower surface thereof, like the above shelf plates 7, is provided with minute through holes connected to a vacuum pump and a valve, both not shown, and thus provided with such suction means that a planar article can be attracted and fixed thereto by a negative pressure. Therefore, the apparatus is so constructed that the laminate unit C disposed between the presser plate 17 and the shelf plate 7 can be attracted and fixed by a negative pressure from not only the downward position but also the upward position.

The heat-up means provided on the presser plates 17 and the shelf plates 7 will be described below.

Figure 6:
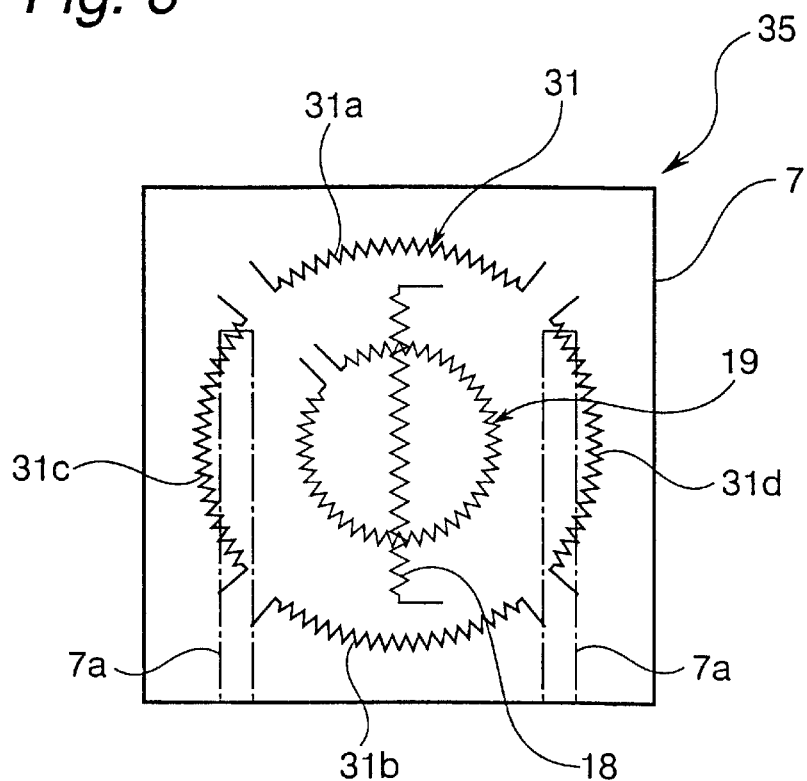
FIG. 6 is a schematic top view of heat-up means provided for shelf plates shown in FIG. 5.

The heat-up means 35 provided on the presser plates 17 and the shelf plates 7 have exactly the same construction, so that description will be made with reference only to the heat-up means 35 provided on the shelf plates 7. As shown in FIG. 6, these heat-up means 35 include two heat-up parts, i.e., outer heater 31 for heating an outer region and inner heater 19 for heating an inner region. The outer heater 31 includes four heater parts 31a, 31b, 31c, 31d arranged so as to form a ring. The inner heater 19 is provided in approximately ringlike form inside the outer heater 31. With respect to the inner heater 19, it is provided with not only the ringlike part but also linear heater part 18 arranged so as to cross the center of the ringlike part.

Figure 7:
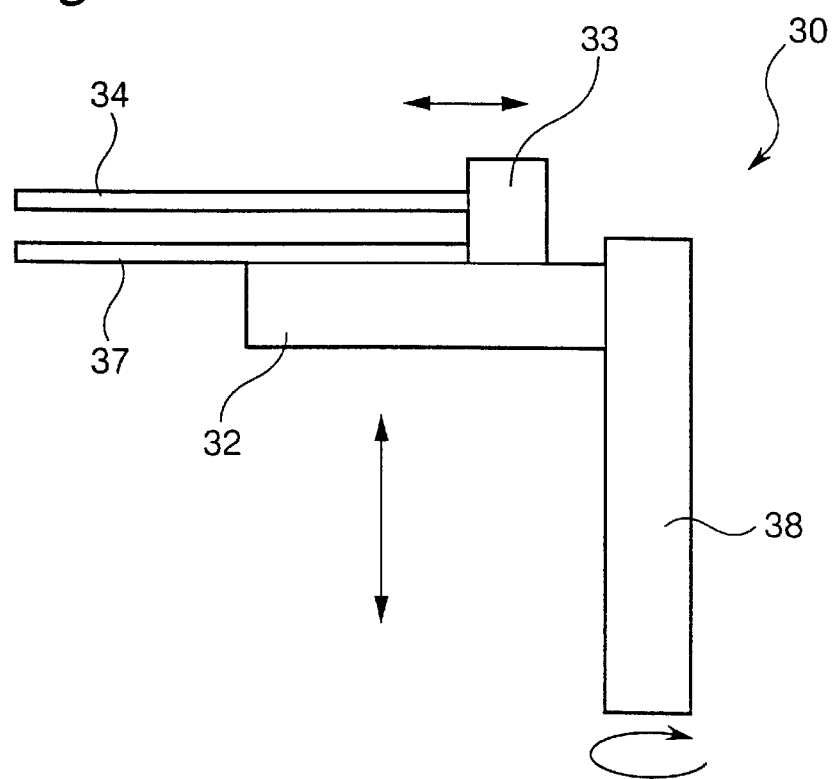
FIG. 7 is a side view of takeout means for taking out laminate units shown in FIG. 2.

Now, takeout means for performing taking in and out of the laminate unit C, arranged in front of the high-temperature chamber 4 of the detacher apparatus 20, will be described with reference to FIGS. 2 and 7.

Specifically, the takeout means 30 is installed in the vicinity of the lid 6 as a constituent of the high-temperature chamber 4. The takeout means 30 includes rotatable pillar 38 and vertically movable horizontal plate 32. The vertically movable horizontal plate 32 is provided with guide rails, not shown. The apparatus is so constructed that slider 33 can be moved on the guide rails in the horizontal direction as shown by arrow in FIG. 7. The slider 33, as shown in FIGS. 2 and 7, is provided with carrier arms 34, 37 vertically opposite to each other, each of which includes a pair of leftward and rightward arranged arm members. Either or both of the carrier arms are constructed so as to be vertically movable in order to enable the upper carrier arms 34 to approach to or draw apart from the lower carrier arms 37. The carrier arms 34, 37 are provided with the same suction means as those of the above presser plates 17 and shelf plates 7, so that the laminate unit C accommodated between the carrier arms 34, 37 can be attracted and fixed by the suction means. As shown in FIG. 6, each of the shelf plates 7 is provided with grooves 7a or slits as shown by dotted dash lines in FIG. 6 so that the lower carrier arms 37 can accomplish entry and exit without being brought into contact with the laminate unit C disposed on the shelf plates 7 (with suction).

A method of detaching an article with the use of the detacher apparatus of this embodiment and functions thereof will be described below.

In this embodiment, the laminate unit C is formed through various prior steps. Specifically, for example, the step of sticking a semiconductor wafer as article B to a glass plate (support plate A) by means of pressure sensitive adhesive double coated sheet 1 and the back grinding step in which the semiconductor wafer is ground to a given thickness are carried out in the prestage of this embodiment. In this embodiment, the article B is a semiconductor wafer which has been ground to an extremely small thickness but has not yet been divided into individual chips.

In the prestage of the detaching method of this embodiment, the laminate unit C is irradiated with ultraviolet light so that the adhesive strength of the pressure sensitive adhesive layers of both sides is sharply dropped. In this state, the laminate unit C is stocked in advance in an accommodation cassette, not shown. Further, the inside of the high-temperature chamber 4 is heated in advance to high temperature to an extent such that the heat shrinkable base 3 is not deformed by the heat-up means 15 provided on the side walls 8a to 8d of the chamber frame 5 of the high-temperature chamber 4 in order to shorten the time required for the heating by the heat-up means 35 provided on shelf plates 7 and presser plates 17.

Subsequently, the lid 6 is opened to thereby expose the opening 5a of the high-temperature chamber 4. Laminate units C stocked in the accommodation cassette are sequentially taken out by appropriate means and placed on the shelf plates 7 of the high-temperature chamber 4, and the lid 6 is closed. In that instance, the takeout means 30 shown in FIG. 2 may be used as the means for taking out laminate units C from the accommodation cassette and carrying them onto the shelf plates 7 of the high-temperature chamber 4.

Upon the setting of laminate unit C on the shelf plate 7, the presser plate 17 is moved downward until the presser plate 17 contacts the laminate unit C. When the presser plate 17 is contacted with the laminate unit C, the suction means of the presser plate 17 and shelf plate 7 are operated so that the laminate unit C is attracted and fixed between the presser plate 17 and the shelf plate 7. In this state, on the laminate unit C, the downward gravity of the presser plate 17 substantially balances with the upward tensile force by the elongated spring 22 with the result that there is substantially no load on the laminate unit C.

Thereafter, the laminate unit C is directly heated from not only the side of support plate A but also the side of article B by means of the heat-up means 35 of the presser plate 17 and shelf plate 7 in the high-temperature chamber 4, namely in the chamber frame 5. In this direct heating, the heating by means of the outer heater 31 is initially effected, and, thereafter, the heating by means of the inner heater 19 is carried out. In this manner of heating, the heat shrinkable base 3 of the pressure sensitive adhesive double coated sheet 1 in an outer region is initially shrunk by the heating by means of the outer heater 31. As emphatically shown in FIG. 8, air is dragged inwards from the periphery of the laminate unit C into the interstices between the pressure sensitive adhesive double coated sheet 1 and the article B and between the pressure sensitive adhesive double coated sheet 1 and the support plate A to thereby initiate peeling. The subsequent heating by means of the inner heater 19 causes the heat shrinkable base 3 to shrink in an inner region. Thus, peeling is propagated to the inner region with the result that, through all the surface of the laminate unit C, the article B, the pressure sensitive adhesive double coated sheet 1 and the support plate A are completely peeled from each other. In that instance, when the pressure sensitive adhesive double coated sheet 1 initiates shrinkage, a new deforming force due to the shrinkage is exerted in the direction toward an increase of the distance between the support plate A (glass plate) and the article B (wafer), i.e., the vertical direction. Although the presser plate 17 is lifted upwards by the deforming force of the pressure sensitive adhesive double coated sheet 1, the presser plate 17 is in such a state that the gravity thereof substantially balances with the tensile force of the spring 22 with the result that there is substantially no load on the laminate unit C. Accordingly, the deformation of the pressure sensitive adhesive double coated sheet 1 is advanced without being hindered by the weight of the presser plate 17. As a result, the distance between the support plate (glass plate) A and the article (wafer) B is increased, resulting in the formation of a gap. Thus, the area of contact of the pressure sensitive adhesive double coated sheet 1 with the article B is reduced, so that the article B lifts up from the pressure sensitive adhesive double coated sheet 1.

Upon recognition of the completion of the shrinkage of pressure sensitive adhesive double coated sheet by heating and upon recognition of the completion of the above peeling, the suction means of the presser plate 17 is disengaged, and the presser plate 17 is retreated to an upward waiting position.

The means for recognizing the completion of the peeling may comprise detecting whether or not the gap has reached a given level with the use of a sensor, or may comprise judging by time set in advance for the completion of the peeling by means of a timer.

The resultant laminate unit C is taken out from the high-temperature chamber 4. At that time, the lid 6 is slid to thereby expose the opening 5*a*. Also, the suction means of the shelf plate 7 is disengaged. Subsequently, as shown in FIG. 2, the carrier arms 34, 37 of the takeout means 30 are disposed so as to face the interior of the high-temperature chamber 4. The slider 33 is moved on the guide rails of the horizontal plate 32 toward the high-temperature chamber 4 to thereby have the lower carrier arm members 37, 37 admitted in the grooves 7*a*, 7*a* of the shelf plate 7. At that time, the presser plate 17 lies in the vertical waiting position, so that there is a space between the article B and the presser plate 17. The upper carrier arm 34 is inserted in the space. The carrier arms 34, 37 are moved so as to approach to each other with the result that the laminate unit C is held between the carrier arms 34, 37. In this state, the laminate unit C is attracted to the carrier arms 34, 37 by operating suction means provided in the carrier arms 34, 37. While maintaining the suction, the slider 33 is moved on the guide rails of the horizontal plate 32 so as to become distant from the high-temperature chamber 4. Thus, the laminate unit C having undergone the above peeling is taken out from the high-temperature chamber 4.

After the takeout of the laminate unit C from the high-temperature chamber 4 by the use of the takeout means 30, while keeping the suction means operated, air is driven from air blow nozzle 36 through the interstice between the pair of carrier arms 34, 37, as shown in FIG. 9. As a result, the pressure sensitive adhesive double coated sheet 1 about to be separated from the article B and the support plate A is blown off. The pressure sensitive adhesive double coated sheet 1 blown off can be collected in dust box 28.

The detached support plate (glass plate) A and article (semiconductor wafer) B are thereafter accommodated in separate cassettes.

As is apparent from the foregoing, the detacher apparatus of this embodiment enables efficiently detaching a vast plurality of extremely thin articles fixed through a pressure sensitive adhesive double coated sheet within a short period of time without damaging them.

The detaching method and detacher apparatus according to one embodiment of the present invention are as described above, to which, however, the present invention is in no way limited.

In the above embodiment, the pressure sensitive adhesive double coated sheet 1 about to be detached is blown off by driving air thereto, to which, however, the removing method of the present invention is not limited. For example, the pressure sensitive adhesive double coated sheet 1 can be scraped out by mechanical means. Alternatively, the pressure sensitive adhesive double coated sheet 1 can be dropped by the action of gravity. In short, what is important is to avoid damaging of the wafer B by strong rubbing with the tape (or the like).

Further, in the above embodiment, inner and outer heat-up means 35 are separately provided, and the outer region is heated up prior to the inner region. However, the present invention is not limited thereto. For example, it is also feasible to provide such a construction that the temperature is raised at the outer region earlier than at the inner region by the use of a difference in specific heat or heat conductivity.

Still further, heaters as the heat-up means can be arranged in various fashions. For example, when the article is circular, the heater is divided into parts for heating a peripheral region of the circle and parts for heating an inner region of the circle, which parts may be arranged in concentric form or may be arranged in striplike form, i.e., at an end portion of the circle, the center and the opposite end portion.

Furthermore, preliminary heating such as high-temperature chamber 4 is performed in the high-temperature chamber 4 in the above embodiment. However, the preliminary heating is not essential.

Moreover, the manner of construction of the high-temperature chamber 4 is not limited to that of the above embodiment, and other forms can be employed.

As apparent from the foregoing, in the method of detaching an article fixed through a pressure sensitive adhesive double coated sheet according to the present invention, at least one outer part of the article is initially heated and satisfactorily peeled and thereafter a part heated up later is peeled, even when an extremely thin article stuck to a pressure sensitive adhesive double coated sheet is to be detached. Consequently, the article can be easily detached from the pressure sensitive adhesive double coated sheet without cracking of the article.

The detacher apparatus of the present invention has a compact structure and is suitable for carrying out the method of the present invention.

What is claimed is:

1. A method of detaching an article from a laminate unit, the laminate unit comprising a support plate and, fixed thereto, the article, the fixing effected through a pressure sensitive adhesive double coated sheet deformable by heating to thereby exert a peeling effect, said laminate unit being dimensioned such that the pressure sensitive adhesive double coated sheet, the support plate and the article have substantially the same configuration, said method comprising:

heating at least one outer part of the laminate unit so that at least part of an outer region of the laminate unit is initially heated up, with other regions heated up later, and detaching the article from the pressure sensitive adhesive double coated sheet in a direction from the outer region toward the other regions.

2. The method as claimed in claim 1, wherein said initially heated up outer region of the laminate unit is a peripheral region extending in approximately a doughnut shape from a center of the laminate unit.

* * * * *

UNITED STATES PATENT AND TRADEMARK OFFICE
CERTIFICATE OF CORRECTION

PATENT NO. : 6,649,017 B1  Page 1 of 1
DATED : November 18, 2003
INVENTOR(S) : Shuji Kurokawa It is certified that error appears in the above-identified patent and that said Letters Patent is hereby corrected as shown below:

<u>Column 1,</u>
Line 61, "the object of an" should read -- an object of the --.

Signed and Sealed this

Sixteenth Day of March, 2004

JON W. DUDAS
*Acting Director of the United States Patent and Trademark Office*